United States Patent
So et al.

(10) Patent No.: US 7,298,665 B2
(45) Date of Patent: Nov. 20, 2007

(54) DUAL-MODE DECODER CIRCUIT, INTEGRATED CIRCUIT MEMORY ARRAY INCORPORATING SAME, AND RELATED METHODS OF OPERATION

(75) Inventors: Kenneth K. So, Belmont, CA (US); Luca G. Fasoli, San Jose, CA (US); Roy E. Scheuerlein, Cupertino, CA (US)

(73) Assignee: SanDisk 3D LLC, Milpitas, CA (US)

( * ) Notice: Subject to any disclaimer, the term of this patent is extended or adjusted under 35 U.S.C. 154(b) by 391 days.

(21) Appl. No.: 11/026,493

(22) Filed: Dec. 30, 2004

(65) Prior Publication Data

US 2006/0145193 A1    Jul. 6, 2006

(51) Int. Cl.
G11C 8/00 (2006.01)
G11C 7/00 (2006.01)

(52) U.S. Cl. ............... 365/230.06; 365/63; 365/201

(58) Field of Classification Search ........... 365/230.06, 365/201, 63
See application file for complete search history.

(56) References Cited

U.S. PATENT DOCUMENTS

| | | | |
|---|---|---|---|
| 4,646,266 A | 2/1987 | Ovshinsky et al. | |
| 5,751,012 A | 5/1998 | Wolstenholme et al. | |
| 5,835,396 A | 11/1998 | Zhang | |
| 5,963,500 A | 10/1999 | Taura et al. | |
| 6,034,882 A | 3/2000 | Johnson et al. | |
| 6,055,180 A | 4/2000 | Gudesen et al. | |
| 6,111,808 A * | 8/2000 | Khang et al. | 365/230.06 |
| 6,185,121 B1 | 2/2001 | O'Neill | |
| 6,185,122 B1 | 2/2001 | Johnson et al. | |
| 6,191,999 B1 | 2/2001 | Fujieda et al. | |
| 6,363,000 B2 | 3/2002 | Perner et al. | |
| 6,407,953 B1 | 6/2002 | Cleeves | |
| 6,418,076 B2 * | 7/2002 | Kawamata | 365/230.06 |
| 6,420,215 B1 | 7/2002 | Knall et al. | |
| 6,522,594 B1 | 2/2003 | Scheuerlein | |
| 6,545,898 B1 | 4/2003 | Scheuerlein | |
| 6,567,287 B2 | 5/2003 | Scheuerlein | |
| 6,591,394 B2 | 7/2003 | Lee et al. | |
| 6,618,295 B2 | 9/2003 | Scheuerlein | |
| 6,631,085 B2 | 10/2003 | Kleveland et al. | |

(Continued)

OTHER PUBLICATIONS

Naji, Peter K., et al., "A 256kb 3.0V 1T1MTJ Nonvolatile Magnetoresistive RAM," 2001 IEEE ISSCC, Feb. 6, 2001, Paper 7.6, and associated slide handouts, 35 pages.

(Continued)

*Primary Examiner*—Son Dinh
(74) *Attorney, Agent, or Firm*—Zagorin O'Brien Graham LLP (57) ABSTRACT

In an embodiment of the invention an integrated circuit includes a memory array having a first plurality of decoded lines traversing across the memory array and a pair of dual-mode decoders, each decoder coupled to each of the plurality of decoded lines a respective location along said decoded lines, such as at opposite ends thereof. Both decoder circuits receive like address information. Normally both decoder circuits operate in a forward decode mode to decode the address information and drive a selected one of the decoded lines. During a test mode, one decoder is enabled in a reverse decode mode while the other decoder remains in a forward decode mode to verify proper decode operation and integrity of the decoded lines between the decoders.

43 Claims, 5 Drawing Sheets

U.S. PATENT DOCUMENTS

| | | |
|---|---|---|
| 6,735,104 B2 | 5/2004 | Scheuerlein |
| 6,760,253 B2 * | 7/2004 | Kamei .................. 365/185.11 |
| 6,768,685 B1 | 7/2004 | Scheuerlein |
| 6,859,410 B2 | 2/2005 | Scheuerlein et al. |
| 6,876,569 B2 | 4/2005 | Itoh et al. |
| 6,901,006 B1 | 5/2005 | Kobayashi et al. |
| 7,023,739 B2 | 4/2006 | Chen et al. |
| 2001/0055838 A1 | 12/2001 | Walker et al. |
| 2002/0028541 A1 | 3/2002 | Lee et al. |
| 2003/0021148 A1 | 1/2003 | Scheuerlein |
| 2003/0202404 A1 | 5/2003 | Scheuerlein |
| 2003/0128581 A1 | 7/2003 | Scheuerlein et al. |
| 2003/0202406 A1 | 10/2003 | Issa |
| 2003/0214841 A9 | 11/2003 | Scheuerlein et al. |
| 2004/0100831 A1 | 5/2004 | Knall et al. |
| 2004/0124466 A1 | 7/2004 | Walker et al. |
| 2004/0125629 A1 | 7/2004 | Scheuerlein et al. |
| 2004/0145024 A1 | 7/2004 | Chen et al. |
| 2004/0190360 A1 | 9/2004 | Scheuerlein |
| 2005/0122779 A1 | 6/2005 | Fasoli et al. |
| 2005/0128807 A1 | 6/2005 | Chen et al. |
| 2005/0226049 A1 | 10/2005 | Jeong et al. |
| 2006/0146639 A1 | 7/2006 | Fasoli et al. |

OTHER PUBLICATIONS

Compardo, Giovanni, et al., "40-mm$^2$ 3-V-Only 50-MHz 64-Mb 2-b/cell CHE NOR Flash Memory," IEEE Journal of Solid-State Circuits, vol. 35, No. 11, Nov. 2000, pp. 1655-1667.

Motta, Ilaria, et al., "High-Voltage Management in Single-Supply CHE NOR-Type Flash Memories," Proceedings of the IEEE, vol. 91, No. 4, Apr. 2003, pp. 554-568.

Okuda, Takashi and Murotani, Tatsunori, "A Four-Level Storage 4-Gb DRAM," IEEE Journal of Solid-State Circuits, vol. 32, No. 11, Nov. 1997, pp. 1743-1747.

* cited by examiner

DUAL-MODE DECODER CIRCUIT, INTEGRATED CIRCUIT MEMORY ARRAY INCORPORATING SAME, AND RELATED METHODS OF OPERATION

CROSS-REFERENCE TO RELATED APPLICATION(S)

This application is related to co-pending U.S. application Ser. No. 11/026,470 filed on even date herewith, entitled "Apparatus and Method for Hierarchical Decoding of Dense Memory Arrays Using Multiple Levels of Multiple-Headed Decoders" by Luca G. Fasoli and Kenneth K. So, which application is hereby incorporated by reference in its entirety.

BACKGROUND

1. Field of the Invention

The present invention relates to decoder circuits for integrated circuit memory arrays.

2. Description of the Related Art

Semiconductor integrated circuits have progressively reduced their feature linewidths into the deep sub-micron regime. Moreover, recent developments in certain memory cell technologies have resulted in word lines and bit line having an extremely small pitch. For example, certain passive element memory cell arrays may be fabricated having word lines approaching the minimum feature size (F) and minimum feature spacing for the particular word line interconnect layer, and also having bit lines approaching the minimum feature width and minimum feature spacing for the particular bit line interconnect layer. Moreover, three-dimensional memory arrays having more than one plane of memory cells have been fabricated implanting such so-called $4F^2$ memory cells on each memory plane. Exemplary three-dimensional memory arrays are described in U.S. Pat. No. 6,034,882 to Johnson, entitled "Vertically Stacked Field Programmable Nonvolatile Memory and Method of Fabrication."

SUMMARY

Interfacing the word line decoders and bit line decoders to tightly spaced word lines and bit lines within very dense arrays has become extremely challenging, particularly if such array lines exist on more than one layer, as in a three-dimensional memory array having more than one plane of memory cells.

A hierarchical decoder may be employed to help achieve tight pitch requirements for the array lines. For example, a hierarchical word line decoder may include a first-level decoder for selecting one of a plurality of global word lines, and a second-level decoder for selecting one of a plurality of local word lines associated with the selected global word line. Such a hierarchical decoder structure allows shorter local word lines in each sub-array (i.e., memory block).

In some arrays, the global word lines traverse across all or a large portion of a memory array or sub-array. Such long lines running from one end of an integrated circuit (i.e., a "chip") to the other end may be very resistive as well as capacitively heavily-loaded. As a result, the propagation delay for selecting and de-selecting a long, resistive, and heavily-loaded global array line may be significant.

Rather than using a single decoder to generate the global word lines, two decoders may be employed to drive the global word lines, one decoder driving one end of each global word line, and the other decoder driving the other end of the global word lines. Since intrinsic wire delay is a quadratic relationship with wire length, this reduces the propagation delay to one fourth the previous amount. Normally both decoders are responsive to the same address signals, and would decode and drive the same individual global word line, but from opposite ends. Such operation may be viewed as a "forward decode" mode of operation.

One implication of a hierarchical decoder structure concerns the number of local decoded array lines, such as local word lines, that may be affected by a defect in a global array line, such as a global word line. Such a defect could affect many local word lines in each on many array blocks. For example, an open in a global word line would traditionally affect all local word lines in every memory block located "downstream" of the break in the global word line. But by driving each global word line from both ends, functionally, the global word line can still be selected fully across the entire physical line, and the selected local word line can still be driven to access the memory cells that are associated with the open global word line.

Other potential defects in global word lines and local word lines, such as a shorted line, may require using a marching pattern to detect the failure, even with the use of dedicated test columns. Such a test sequence requires a long test time and is therefore expensive to implement.

Test times may be substantially reduced by providing the global word line decoders with a reverse decode mode of operation in addition to the forward decode mode. In the forward decoding mode, the inputs of such a dual-mode decoder are row address lines (i.e., a partial row address) and the outputs are the global word lines. The decoder decodes the row address and asserts a single global word line. In the reverse decoding mode, the inputs are now the global word lines as well as the row address lines, and the output is a "hit" signal. In the reverse decoding mode, the dual mode decoder compares the row address with the selected global word line (e.g., driven by another global word line decoder in the forward decoding mode). If it matches, the hit signal is asserted. Otherwise, it indicates a failure on that address.

During an exemplary test mode, the first of the two global word line decoders is switched to the reverse decoding mode while the second of the two global word line decoders remains in the forward decoding mode. The second global word line decoder selects and drives one global word line. The first global word line decoder, which is now a reverse decoder, detects whether there is a "hit" between the selected global word line and the input address, and drives the hit output signal accordingly. In some cases, the decoder may be configured to assert the hit signal whenever the selected global word line matches the address. In other cases, even when the selected global word line matches the address, the decoder may be configured to assert the hit signal only if the global word lines adjacent to the selected global word line are both deselected. For example, if there is a short between the selected global word line and one or both adjacent "unselected" global word lines, the dual-mode decoder may nonetheless detect a "miss" rather than a "hit." The addresses provided to the global word line decoder may be sequenced through all possible values in a relatively short amount of time.

Continuing with the exemplary test mode, the first global word line decoder may be switched to the forward decoding mode while the second global word line decoder is switched to the reverse decoding mode. The first global word line decoder now selects and drives one global word line, while the second global word line decoder detects whether there is a "hit" between the selected global word line and the input address, and drives the hit output signal accordingly. The addresses provided to the global word line decoder may again be sequenced through all possible values in a relatively short amount of time. If the hit signal is asserted for all addresses, during both passes through the sequenced addresses, both global word line decoders may be then known to be fully functional. Moreover, if the two global word line decoders drive each global word line at the opposite ends of such global word lines, it is then known that none of the global word lines have an open somewhere along its length between the two decoders. In addition, if the dual mode decoders are configured to reject a "hit" when an adjacent global word line is also selected (or even partially selected), then it may be also known that no such shorts exist between any of the global word lines.

The above description of a hierarchical decoder structure using two dual-mode global word line decoders is presented as an illustrative introduction to the invention, but should not be viewed as limiting of the invention. Many other structures are contemplated, including non-hierarchical decoders, and decoders for other than global word lines, such as decoders for individual word lines or bit lines, decoders for global bit lines, and multiple decoders connected at locations other than at opposite ends of the decoded lines. In addition, the invention need not require dual-mode decoders. For example, a forward decoder at one end of a decoded line and a reverse decoder at the opposite end may be employed. Many other configurations, structures, and related methods of operation are contemplated.

For example, in one aspect the invention provides an integrated circuit which includes a memory array having a first plurality of decoded lines traversing across the memory array in a first direction and a pair of decoder circuits, one decoder circuit coupled to each of the plurality of decoded lines at one respective location along said decoded lines, and the other decoder circuit coupled to each of the plurality of decoded lines at another respective location along said decoded lines, both decoder circuits coupled to receive like address information.

In some embodiments, both decoder circuits may be enabled in a forward decode mode to decode the address information and drive a selected one of the decoded lines during a normal operating mode.

In some embodiments, one decoder has at least a forward decode mode of operation and the other has at least a reverse decode mode of operation, arranged so that one decoder may be enabled in the reverse decode mode when the other decoder is enabled in the forward decode mode.

One or both of the decoders may have both a forward decode mode of operation and a reverse decode mode of operation. During a normal operating mode, one or both decoders may be enabled in the forward decode mode. During a first test mode, one decoder may be enabled in the reverse decode mode and the other decoder may be enabled in the forward decode mode. During a second test mode, the other decoder may be enabled in the reverse decode mode and the one decoder may be enabled in the forward decode mode.

The pair of decoder circuits may be respectively coupled to each of the plurality of decoded lines generally at opposite ends of the decoded lines. The integrated circuit may include a three-dimensional memory array having more than one plane of memory cells formed above a substrate.

The plurality of decoded lines may represent global word lines, and in some embodiments the global word lines may be coupled to multi-headed local word line drivers associated with memory blocks traversed by the global word lines. In some embodiments the plurality of decoded lines may represent local array lines coupled directly to memory cells.

In some aspects, the invention provides for an integrated circuit embodied in computer readable descriptive form suitable for use in design, test or fabrication of the integrated circuit.

In some aspects, the invention provides a method for operating an integrated circuit including a memory array, said memory array including a plurality of decoded lines traversing across the memory array and further including a first and second dual-mode decoder circuit respectively coupled to the plurality of decoded lines at respective different locations along said decoded lines. The method includes presenting address information to both the first and second decoder circuits. In a normal operating mode, the method further includes enabling both the first and second decoder circuits in a forward decode mode, thereby decoding the address information and driving a selected one of the plurality of decoded lines from said two different locations along said line.

In some embodiments the method may provide a first test mode which includes enabling the first decoder circuit in the forward decode mode, thereby decoding the address information and driving a selected one of the plurality of decoded lines, and enabling the second decoder circuit in a reverse decode mode, thereby comparing the address information and the selected one of the plurality of decoded lines, and driving an output match signal if the address information corresponds to the selected one of the plurality of decoded lines. The method may also include sequencing through the address information.

The method may include a second test mode which includes enabling the second decoder circuit in the forward decode mode, thereby decoding the address information and driving a selected one of the plurality of decoded lines, and enabling the first decoder circuit in the reverse decode mode, thereby comparing the address information and the selected one of the plurality of decoded lines, and driving the output match signal if the address information corresponds to the selected one of the plurality of decoded lines.

In another aspect, the invention provides for a decoder circuit configured, in a first mode of operation, for decoding address information conveyed thereto and asserting a corresponding one of a plurality of decoded outputs, and further configured, in a second mode of operation, for asserting a match signal if the address information corresponds to an asserted one of the plurality of decoded outputs which is asserted external to the decoder circuit.

In some embodiments, the present invention provides a three-dimensional electrically programmable read-only memory (EPROM) array having word lines formed by multiple layers of local word line segments which are connected by a shared vertical connection to an associated local word line driver circuit which is responsive to an associated global word line.

The invention in several aspects is suitable for integrated circuits having a memory array, for methods for operating such integrated circuits and memory arrays, and for computer readable media encodings of such integrated circuits or memory arrays, all as described herein in greater detail and as set forth in the appended claims.

The foregoing is a summary and thus contains, by necessity, simplifications, generalizations and omissions of detail. Consequently, those skilled in the art will appreciate that the foregoing summary is illustrative only and that it is not intended to be in any way limiting of the invention. Other aspects, inventive features, and advantages of the present invention, as defined solely by the claims, may be apparent from the detailed description set forth below.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
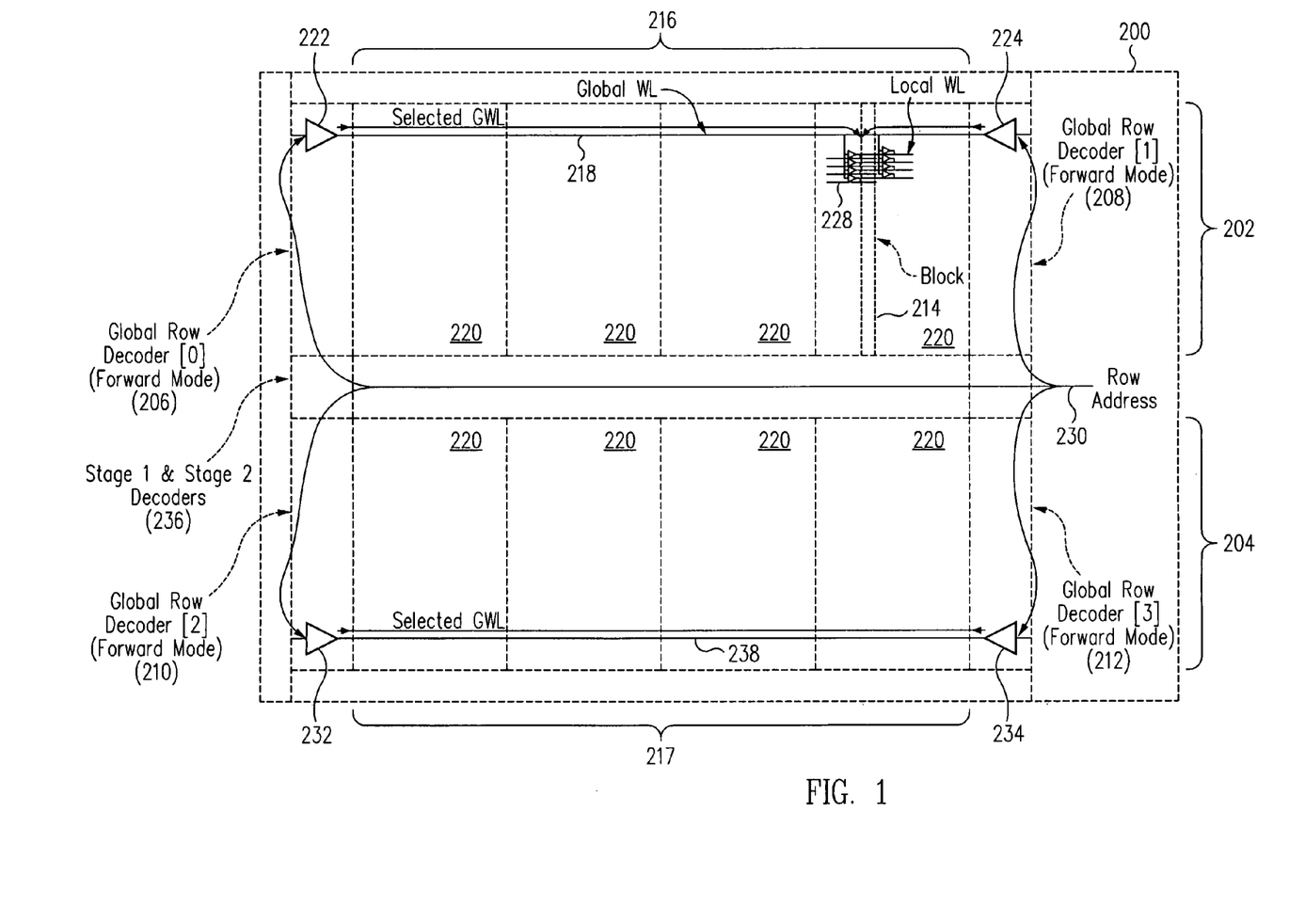
FIG. 1 depicts an exemplary embodiment incorporating a pair of dual-mode decoder circuits in accordance with some embodiments of the present invention.

Referring now to FIG. 1, an exemplary integrated circuit 200 includes two memory arrays, one organized as part of an upper stripe 202, and the other organized as part of the lower stripe 204. The upper stripe 202 includes a memory array 216, a first dual-mode global word line decoder 206 disposed at the left side of memory array 216, and a second dual-mode global word line decoder 208 disposed at the right side of memory array 216. Both dual-mode decoders 206 and 208 are responsive to row addresses conveyed on row address lines 230.

The lower stripe 204 includes another memory array 217, a first dual-mode global word line decoder 210 disposed at the left side of memory array 217, and a second dual-mode global word line decoder 212 disposed at the right side of memory array 217. Both dual-mode decoders 210, 212 are also responsive to the row addresses 230.

In the upper memory array 202, the global word lines traverse across the entire memory array 216. One such global word line 218 is shown, being driven by driver 222 within global word line decoder 206, and also driven by driver 224 within global word line decoder 208. The memory array 216 includes a plurality of memory blocks. One such memory block 214 is shown which includes interdigitated local word lines, one of which is labeled 228. In memory block 214, a four headed local word line driver is associated with global word line 218 and drives for local word lines exiting memory block 214 on the left side of the block. In addition, another four headed local word line driver is also associated with global word line 218 and drives four local word lines exiting memory block 214 on the right side of the block. In some preferred embodiments, the memory array includes a three-dimensional memory array of programmable anti-fuse passive element memory cells. Such a memory organization and structure is described in greater detail in U.S. Patent Application Publication No. US 2004-0190360 A1, entitled "Word Line Arrangement Having Multilayer Word Line Segments for Three-Dimensional Memory Array", which application is incorporated herein by reference in its entirety.

As depicted, the global word lines traverse across the entire memory. In the exemplary integrated circuit shown, such global word lines may run almost from one side of the integrated circuit to the other side. Moreover, in some exemplary embodiments incorporating a three-dimensional memory array, these global word lines may be routed in wiring layers below the memory array, and consequently may be implemented using materials, such as tungsten and polysilicon, which can withstand the high temperature processing of later fabrications steps necessary to fabricate the memory array layers above the global word lines. Since such materials are not as conductive as many common metals and metal alloys used in integrated circuit fabrication, such global word lines may be very resistive. In addition, each global word line is connected to a 4-headed local word line driver in every memory block. In the exemplary structure depicted, there are 64 memory blocks (such as memory block 214), and thus sixty-four 4-headed local word line drivers coupled to each physical global word line, so the total capacitive loading on each global word line is also very large. The time that it would take to charge and discharge these global word lines using only a single decoder would be relatively long (e.g., 2 μs), and would contribute to the overall reading or programming time.

By using two logically-identical global word line decoders (i.e., decoding the same global word line for the same input row address), and driving each global word line at both ends, this delay may be reduced to approximately one-fourth as much (e.g., 500 ns). During normal operation such as read mode or write mode, both global word line decoders 206, 208 are enabled in a forward decoding mode to select and drive a single global word line. To read or write the selected byte in the memory array, only a single block gets enabled (e.g., block 214) and only a single local word line gets selected (e.g., one of the local word lines 228).

The lower memory strip 204 is similarly configured. In the lower memory array 217, the global word lines traverse across the entire memory array 217. One such global word line 238 is shown, being driven by driver 232 within global word line decoder 210, and also driven by driver 234 within global word line decoder 212. During normal operation such as read mode or write mode, both global word line decoders 210, 212 are enabled in a forward decoding mode to select and drive a single global word line, such as global word line 238, from both ends.

As can be appreciated in FIG. 1, a defect in a global word line may affect a great many local word lines. In the exemplary memory array depicted in FIG. 1, there are around 1024 physical global word lines in the entire memory array (i.e., both the upper stripe 202 and the lower stripe 204). These global word lines cover ~12% of the total area of one particular interconnect layer on the entire integrated circuit (as well as some percentage of other interconnect layers). Any defects that land on this portion could potentially affect one or more global word lines. A single defective global word line could wipe out 256 pages of data!

For example, an "open" (i.e., a broken line) in a global word line would traditionally affect all local word lines in every memory block located "downstream" of the break in the global word line. But by driving each global word line from both ends, functionally the global word line can still be selected fully across the entire physical line, and the selected local word line can still be driven to access the memory cells that are associated with the broken physical global word line.

Other potential defects in global word lines and local word lines, such as a shorted line, may require using a marching pattern to detect the failure, even with the use of dedicated test columns. For example, in certain embodiments each word line segment may include at least one test cell for use in confirming that the word line segment (and the memory cells coupled thereto) is functional. Exemplary use of such test cells is described in U.S. Pat. No. 6,407,953 to Cleeves, which is incorporated herein by reference in its entirety. Such a test sequence requires a long test time and is therefore expensive to implement.

Figure 2:
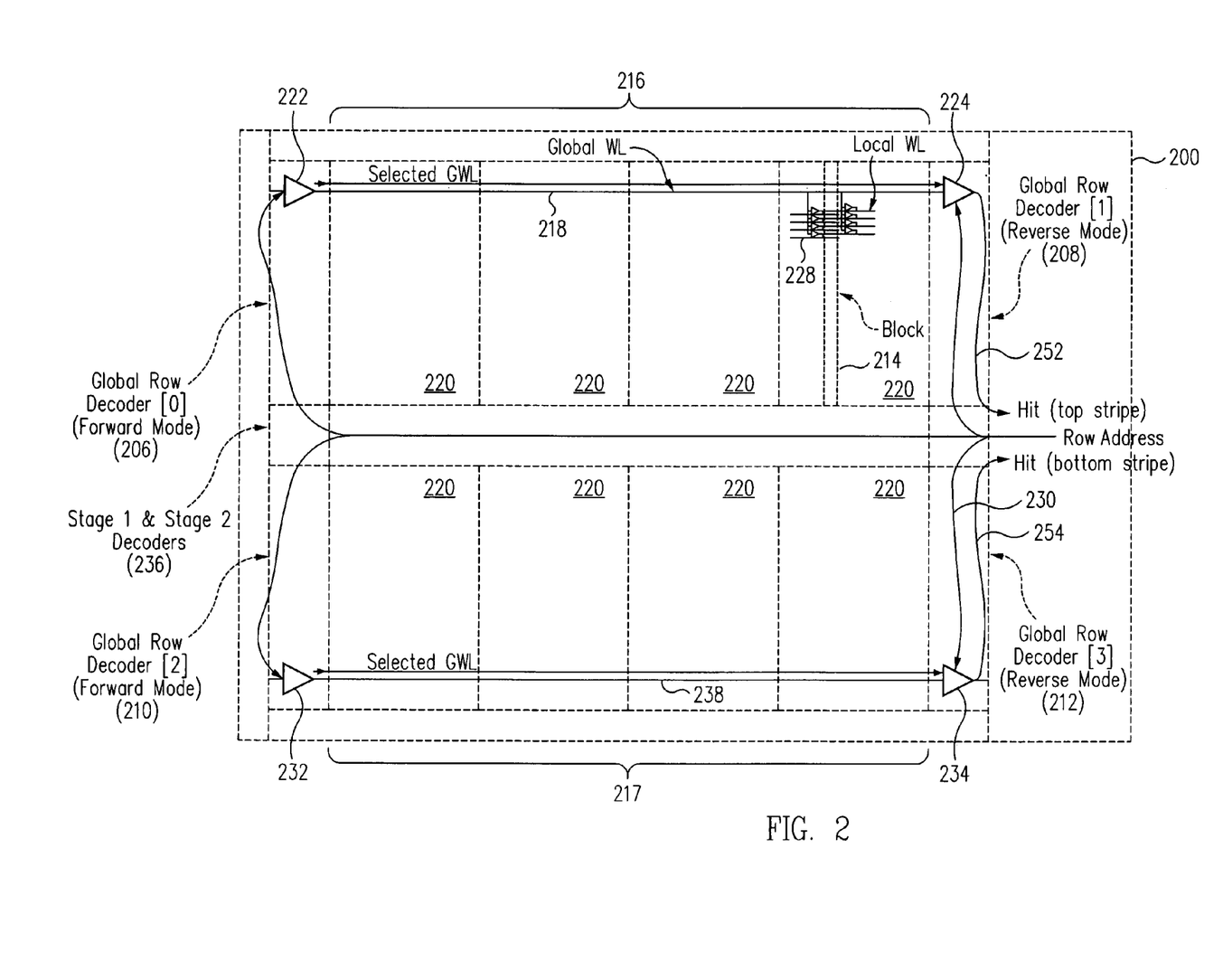
FIG. 2 depicts the embodiment shown in FIG. 1 during operation in a first test mode, in which one of the dual-mode decoder circuits operates in a forward decoding mode, and the other dual-mode decoder circuits operates in a reverse decoding mode.

Referring now to FIG. 2, the exemplary integrated circuit 200 is depicted configured for use in a first test mode, in which one of the dual-mode decoders in switched into a reverse mode of operation. In the reverse decoding mode, the inputs are now the global word lines as well as the row address lines, and the output is a "hit" signal. In the reverse decoding mode, the dual mode decoder compares the row address with the selected global word line (e.g., driven by another global word line decoder in the forward decoding mode). If it matches, the hit signal is asserted. Otherwise, it indicates a failure on that address.

In the first test mode, global word line decoder 208 is switched to the reverse decoding mode while global word line decoder 206 remains in the forward decoding mode. Both decoders 206, 208 are provided the same row address 230, but whereas the global word line decoder 206 selects and drives one global word line (here again depicted as driver 222 driving selected global word line 218), in this mode the global word line decoder 208, which is now a reverse decoder, asserts a hit signal 252 if there is a "hit" between the selected global word line 218 and the row address 230 (i.e., if the particular selected global word line corresponds to the particular row address). The driver 224 is depicted in a reverse orientation, responsive to the row address 230 and the selected global word line 218, for generating the hit signal 252. Exemplary embodiments of such dual mode drivers are described below. Such a hit signal 252 may be a shared hit signal for all reverse mode drivers in the global word line decoder 208, or may be shared by more or less portions of the decoders (e.g., hit signal line 254 in the lower stripe 204). In some preferred embodiments, the decoder 208 may be configured to assert the hit signal 252 only if the global word lines adjacent to the selected global word line are both deselected. In this manner, shorts may be detected between adjacent global word lines. The addresses provided to the global word line decoder may be sequenced through all possible values in a relatively short amount of time to test both the continuity of each global word line from the left side of the array to the right side of the array, as well as to determine whether adjacent line short are present. In this test the global word line decoder configured in the forward decoding mode (i.e., decoder 206) is checked, as well as the selected global word line and the unselected adjacent global word lines.

Figure 3:
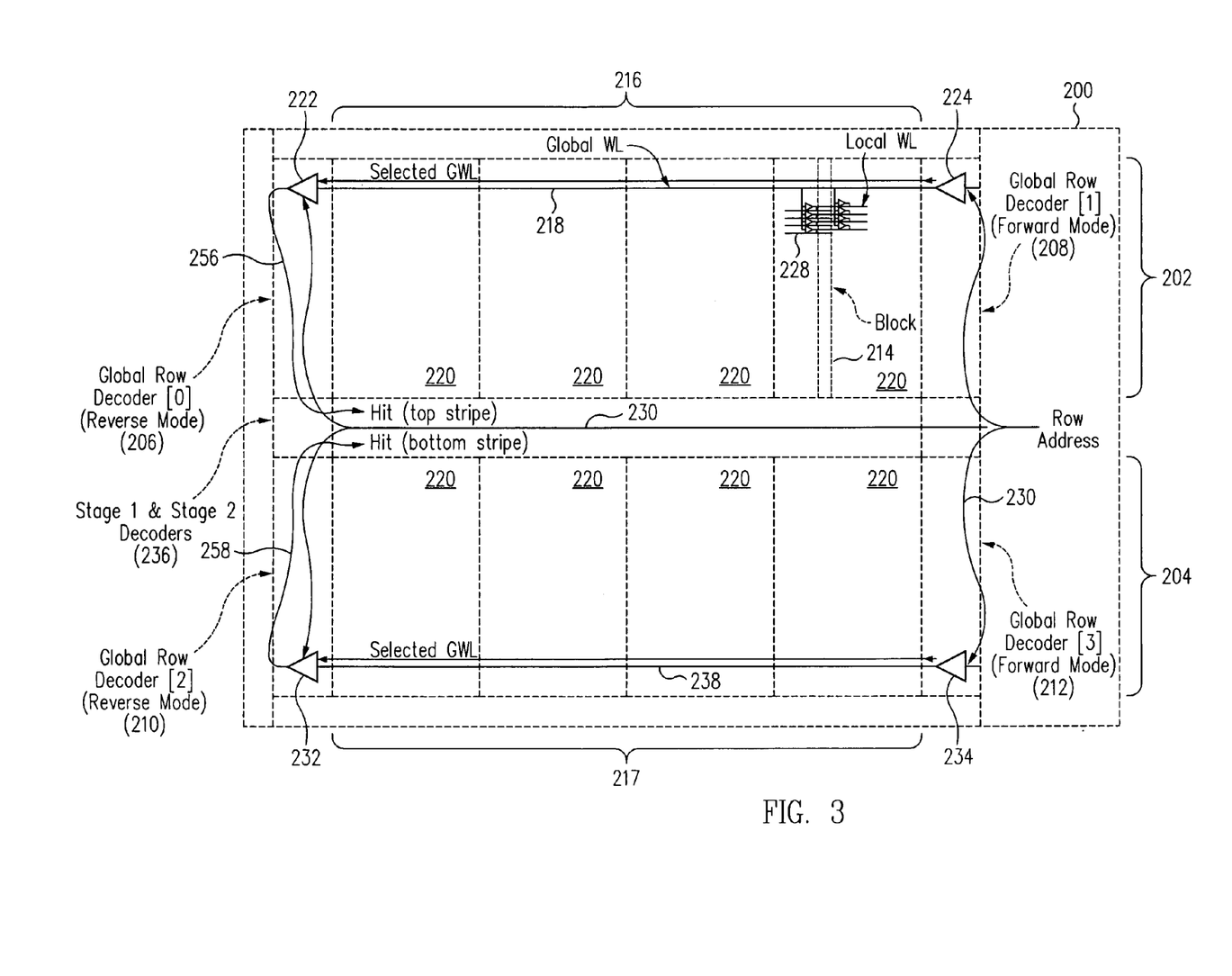
FIG. 3 depicts the embodiment shown in FIG. 1 during operation in a second test mode, in which the other dual-mode decoder circuit operates in the reverse decoding mode, and the one dual-mode decoder circuit operates in a forward decoding mode.

Referring now to FIG. 3, the directionality of the two dual mode global word line decoders in each memory array are reversed. The global word line decoder 208 is switched to the forward decoding mode while the global word line decoder 206 is switched to the reverse decoding mode. Global word line decoder 208 now selects and drives one global word line, while global word line decoder 206 detects whether there is a "hit" between the selected global word line and the input row address, driving a hit signal 256 accordingly. The addresses provided to the global word line decoders may again be sequenced through all possible values in a relatively short amount of time. If the hit signal is asserted for all addresses, during both passes through the sequenced addresses, both global word line decoders may be then known to be fully functional. Moreover, if the two global word line decoders drive each global word line at the opposite ends of such global word lines, it is then known that none of the global word lines have an open somewhere along its length between the two decoders. In addition, if the dual mode decoders are configured to reject a "hit" when an adjacent global word line is also selected (or even partially selected), then it may be also known that no such shorts exist between any of the global word lines.

Redundancy may be provided to cover defective global word lines or defects in one or both global word line decoders. For example, in an exemplary embodiment as depicted in FIG. 1, there may be provided 64 redundant local word lines, associated with 8 redundant global word lines. As an additional form of redundancy, one of the two global word line decoders (e.g., if defective) may be disabled during a normal operating mode, in which case the memory array would operate on just the other global word line decoder, albeit with some performance degradation.

A multi-headed decoder circuit (e.g., the 4-headed local word line drivers on each side of each memory block 214) may be employed to help achieve tight pitch requirements for the array lines (e.g., local word lines). Generally, such a multi-headed decoder may include a group of array line driver circuits associated with a single decode node. Each array line driver circuit may be configured to couple its associated array line (e.g., a word line; a bit line) at times to a first associated bias node which may be generated to convey one of at least two possible bias levels (for example, a selected bias condition or an unselected bias condition) appropriate for the array line. The array line driver circuit may be configured to couple its associated array line at other times to a second associated bias node which is generated to convey at least one possible bias level (for example, an unselected bias condition) appropriate for the array line. As depicted in FIG. 1, a memory array may include many groups of array line drivers (i.e., "decoder heads") for each decode node. Each respective group of decoder heads may share bias nodes, which preferably traverse orthogonal to the decode nodes, with corresponding groups of decoder heads for other decode nodes. Additional details of useful multi-headed decoder configurations are described in greater detail in U.S. Patent Application Publication No. US 2003-0128581 A1, entitled "Multi-Headed Decoder Structure Utilizing Memory Array Line Driver with Dual Purpose Driver Device" by Scheuerlein, et al., which application is hereby incorporated by reference in its entirety.

The global word line decoders 206, 208, 210, 212 may also be configured as multi-headed decoders. While certainly not essential to the present invention, this may be particularly helpful if the pitch of the global word lines is very small, such as might be the case for embodiments incorporating a three-dimensional memory array (i.e., having more than one memory plane). As described below, multi-headed decoder embodiments of the global word line decoders may provide an efficient structure for implementing both a forward and reverse decoding mode of operation. Viewed together with the multi-headed local word line decoders, such a structure may be thought of as a hierarchical decoder circuit using two levels of multi-headed decoders, additional details of which are described in "Apparatus and Method for Hierarchical Decoding of Dense Memory Arrays Using Multiple Levels of Multiple-Headed Decoders" by Luca Fasoli, et al., which application is referenced above and already incorporated by reference in its entirety.

Figure 4:
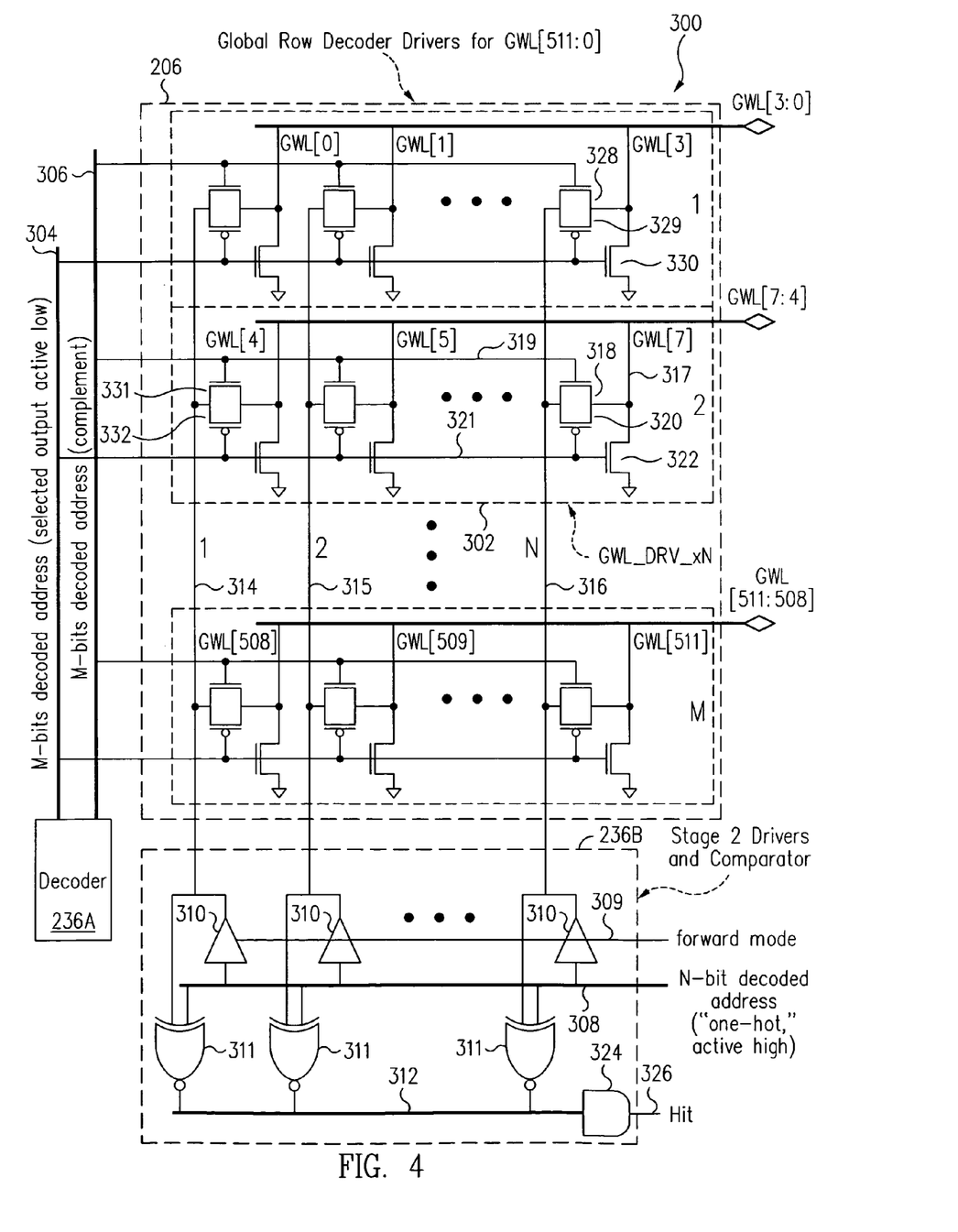
FIG. 4 depicts a multi-headed global word line decoder circuit useful for some embodiments of the present invention.

Referring now to FIG. 4, and multi-headed global word line decoder 300 is depicted. In the exemplary embodiment shown, the global word line decoder 300 is associated with 512 global word lines (labeled GWL[0} through GWL[511]) and corresponds, for example, to the global word line decoder 206 at the left end of the upper memory stripe 202. The global word line decoder 300 includes M instances of a multi-headed global word line driver circuit GWL_Driver_× N, each for driving N global word lines. One of the global word line driver circuits is labeled 302. In the exemplary embodiment shown, assume that there are 512 global word lines, each global word line driver circuit drives 4 global word lines (i.e., N=4), and thus there are 128 global word line driver circuits (M=128). Additional redundant global word lines might add additional circuitry, and of course, such specific numbers are exemplary only and other configurations are contemplated.

To describe the functionality of this global word line decoder, assume that GWL[7] is the selected global word line addressed by the row address information. This global word line GWL[7] is associated with the second global word line driver circuit GWL_Driver_×N, labeled 302, within which transistors 318, 320, and 322 form a three-transistor driver "head" associated with GWL[7].

A portion of the row address is provided to a Stage 1 pre-decoder 236A, which generates an M-bit decoded address 304, a selected one of which is driven low, and which also generates a complement M-bit decoded address 306, a selected one of which is driven high. Each of the M instances of the multi-headed global word line driver circuits receives a corresponding one of true and complement M-bit decoded address signals 304 and 306. The "selected" multi-headed global word line driver circuit 302 thus receives a low signal on node 321 and a high signal on node 319. As a result, the N-channel transistor 318 and the p-channel transistor 320 are both on, and the GWL[7] is coupled to the bias node 316. Likewise, each of the individual global word line driver circuits within the multi-headed global word line driver circuit 302 couples its respective global word line to its associated bias line (i.e., GWL[4] coupled to node 314, GWL[5] coupled to node 315, etc.).

Another portion of the row address is conveyed to a Stage 2 pre-decoder (not shown), which generates an N-bit decoded address 308, a selected one of which is driven high (i.e., a so-called "one-hot" decoded signal). In the forward decoding mode of operation, a forward mode signal 309 is asserted to enable a group of drivers 310 within the Stage 2 Drivers and Comparators Block 236B. When enabled, the drivers 310 drive each bias line 314, 315, . . . , 316 with a corresponding bit of the N-bit address 308. Each of the M instances of the multi-headed global word line driver circuits receives all N of these bias lines 314, 315, . . . , 316. The "selected" multi-headed global word line driver circuit 302 thus receives a low level on bias lines 314 and 315, and a high level on bias line 316.

Since N-channel transistor 318 and p-channel transistor 320 are both on, and since bias line 316 is driven high, the selected global word line GWL[7] is driven high. Likewise, each of the "pass gates" within the other individual global word line driver circuits within the multi-headed global word line driver circuit 302 couples its respective global word line to its associated bias line (i.e., GWL[4] coupled to node 314, GWL[5] coupled to node 315, etc.), and so the non-selected global word lines GWL[4], GWL[5], and GWL [6] (not shown), are driven low. In the forward decoding mode, the Stage 2 drivers 310 are active and the hit signal 326 may be ignored by control logic. The high level conveyed by the selected driver 310, and which level is conveyed to the selected global word line, may be chosen in accordance with implementation specifics of the subsequent level(s) of decoding (e.g., the local word line drivers), and this "high" level need not be a VDD level signal (i.e., the power supply voltage for the circuits) or even closer to VDD than VSS (i.e., ground).

In each of the non-selected multi-headed global word line driver circuits GWL_DRV_×N, the four transmission gates (e.g., transistors 328/329) are off, and the four NMOS pull-down transistors (e.g., transistor 330) are on. Consequently, each of the four associated global word lines is pulled low, as is proper since all of these global word lines are non-selected.

In the reverse decoding mode, the forward mode signal 309 is de-asserted, and the drivers 310 are disabled (i.e., a high output impedance). The transmission gate formed by transistors 318 and 320 is "on" (because node 319 is high and node 321 is low) and drives bias node 316 to the level of node 317. Assuming that GWL[7] is selected and driven by the other decoder at the far end of the global word line, and further assuming that there is no break in the global word line, then node 317 within the multi-headed global word line driver circuit 302 will be driven high, and thus node 316 is also driven high.

In each of the other individual global word line drivers within the multi-headed global word line driver circuit 302, the respective transmission gates are all enabled, and each of the bias lines 314, 315, . . . , 316 are driven to the respective level of the respective global word line associated therewith (i.e., GWL[4], GWL[5], GWL[7]). These bias lines are each coupled to an input of a respective one of a plurality of Exclusive-NOR gates 311 within the Stage 2 Drivers and Comparators block 236B. The other input of each respective XNOR gate 311 is a corresponding one of the N-bit addresses conveyed on bus 308. If the other global word line decoder at the far end is functioning correctly, then only one global word line is driven high and the remaining global word lines are driven low. For example, if GWL[7] is the selected global word line and is correctly driven high by the other global word line decoder, then bias line 316 is also driven high, and the remaining bias lines 314, 315, . . . are driven low. Each of the XNOR gates 311 receives identical inputs if the driven global word line matches the row address (including both the portion conveyed to the Stage 1 Pre-Decoder 236A, and the portion conveyed on bus 308), and each drives its corresponding output to a high level. These individual XNOR outputs form a corresponding bit of bus 312 and are conveyed to an AND gate 324, which drives the hit signal 326 high. Otherwise, the hit signal 326 is driven low to indicate that the driven global word line does not match the row address, or even that no global word line was driven at all.

In the reverse decoding mode only one of the multi-headed global word line driver circuits GWL_DRV_xN is selected, and the levels of the associated global word lines are conveyed to the various bias lines by way of the transmission gates within the selected multi-headed global word line driver circuit GWL_DRV_xN. None of the transmission gates within the remaining non-selected driver circuits are enabled. As a result, a short between two adjacent global word lines, which are in different GWL_DRV_xN blocks, could be missed in the compare mode screening. Fortunately, the circuitry may be configured to prevent such a mis-compare. For example, the NMOS pull-down transistor 322 can be sized much larger than the transmission gate PMOS transistor 320 and NMOS transistor 318. Therefore, if an adjacent global word line is shorted to the selected global word line, the pull-down transistor 322 driving the non-selected "adjacent" global word line low would over-power the pull-up driving the selected global word line high, and both global word lines would have a level low enough to be interpreted by the XNOR gate 311 as unselected.

For example, assume that the other global word line decoder (operating in a forward decoding mode) was selecting and trying to drive GWL[4] high, but a short exists between GWL[4] and the adjacent global word line GWL[3] (which is associated with the adjacent multi-headed global word line driver circuit GWL_DRV_xN). The transistor 330 pulling down GWL[3] may be sized large enough relative to the size of transmission gate 331/332 driving the selected GWL[4] to the bias line 314 level, so that neither GWL[3] nor GWL[4] is driven high enough to appear as a selected global word line to the other decoder operating in the reverse decoding mode. In addition, the XNOR gates 311 can be skewed to have larger size PMOS transistors than NMOS transistors for the bias line input (one of which, normally, is coupled to a single selected global word line). This would require the selected global word line to reach a higher voltage level for the XNOR gate 311 to sense that it is a selected global word line. In addition, one can increase N and decrease M to reduce the number of adjacent global word lines that are in different multi-headed drivers.

It should be apparent that the additional circuitry utilized to implement the reverse decoding mode in FIG. 4 includes only a number N of XNOR gates 311 and a final N-input AND gate 324 (or equivalently, N XOR gates and a final N-input NAND gate). None of the additional circuits are located in pitch sensitive portions of the decoders. This is a truly remarkable achievement.

Figure 5:
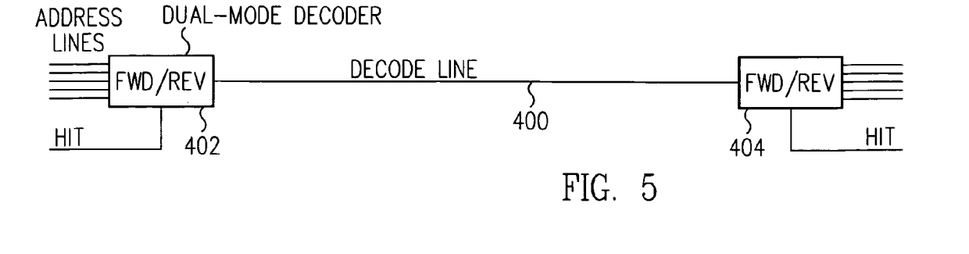
FIG. 5 depicts a pair of dual-mode decoders, each responsive to a group of address lines for generating, in a forward mode of operation, a selected one of a plurality of decode nodes, and for comparing, in a reverse decoding mode, the address to a selected decode line and generating a hit signal if they match.
Figure 6:
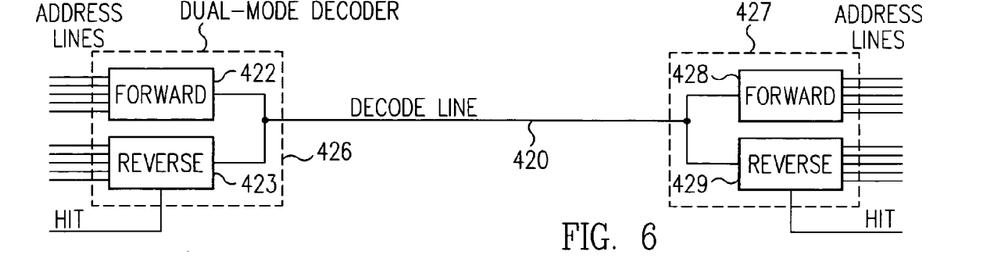
FIG. 6 depicts a pair of dual-mode decoders, each visually represented by a separate forward decoder and a separate reverse decoder.

While the embodiments described thus far are illustrative of the invention, there are many other embodiments that may incorporate various aspects, features, and advantages of the invention. Referring now to FIG. 5, a representation is shown of a pair of dual-mode decoders 402, 404, each responsive to a group of address lines for generating, in a forward mode of operation, a selected one of a plurality of decode nodes (one of which is shown and labeled 400), and for comparing, in a reverse decoding mode, the address to a selected decode line and generating a hit signal if they correspond (i.e., "match"). It may be implied by such a figure and by the compound adjective "dual-mode" that the dual-mode decoders 402, 404 are tightly integrated structures, but such is not at all required. Referring now to FIG. 6, a representation is again shown of a pair of dual-mode decoders 426, 427 as before. In this case, however, the dual mode decoder 426 is visually represented by a separate forward decoder 422 and a separate reverse decoder 423. Likewise, the dual mode decoder 429 is visually represented by a separate forward and reverse decoders 428 and 429. As used herein, a dual-mode decoder circuit is contemplated to include a range of implementations from wholly and completely separate forward and reverse decoders to extremely tightly integrated forward mode and reverse mode decoders.

In many of the embodiments described above, a pair of dual-mode decoders is coupled to opposite ends of each of a group of global decoded lines. Other embodiments are contemplated in which a pair of decoders may be coupled to a group of decoded lines at different locations along the line. The decoders need not be dual-mode, and they need not be coupled at opposite ends of the decoded lines. In additions, such decoded lines need not be global lines, but may be local array lines as might be directly coupled to memory cells in the array.

Figure 7:
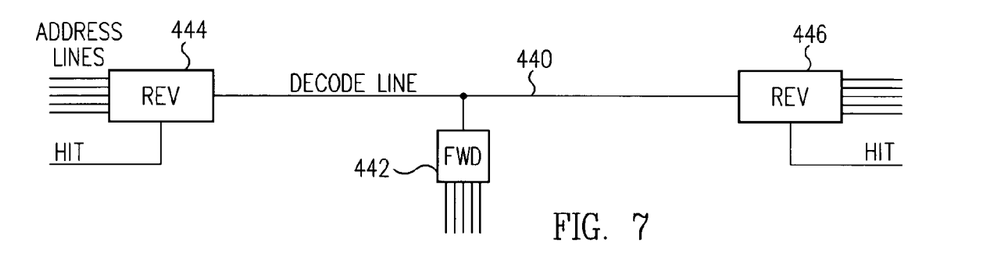
FIG. 7 depicts a forward-only decoder coupled to the approximate center of a group of decoded lines, and a respective reverse decoder coupled at each end of the decoded lines.

In FIG. 7 a forward-only decoder 442 is coupled to the approximate center of the decoded lines, and a respective reverse decoder 444, 446 is coupled at each end of the decoded lines 440. This configuration still achieves the decrease in propagation delay down the decoded line, and also allows for testing the forward decoder using two different reverse decoders, each of which also serves to verify that no opens exist in the decoded line in the respective half of the array served by the respective reverse decoder.

Figure 8:
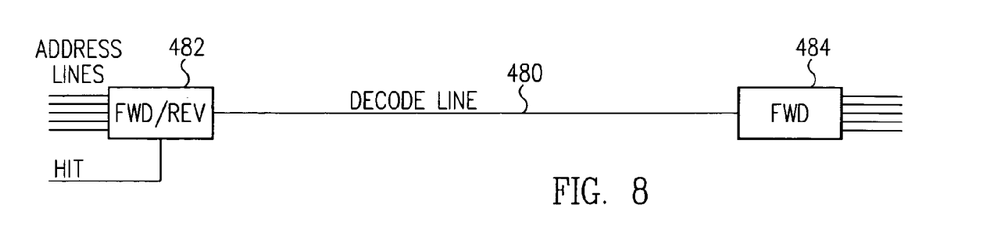
FIG. 8 depicts a pair of decoders coupled to opposite ends of each of a group of decoded lines, but only one of the decoders is a dual-mode decoder.

In FIG. 8 a pair of decoders 482, 484 is coupled to opposite ends of each of a group of decoded lines 480, but only one of the decoders (i.e., decoder 482) is a dual-mode decoder. This configuration still achieves the decrease in propagation delay down the decoded line, and also allows for testing the forward decoder 484 using the decoder 482 in the reverse mode, which also serves to verify that no opens exist in the decoded lines 480 (and optionally, no shorted lines, adjacent lines, either).

Figure 9:
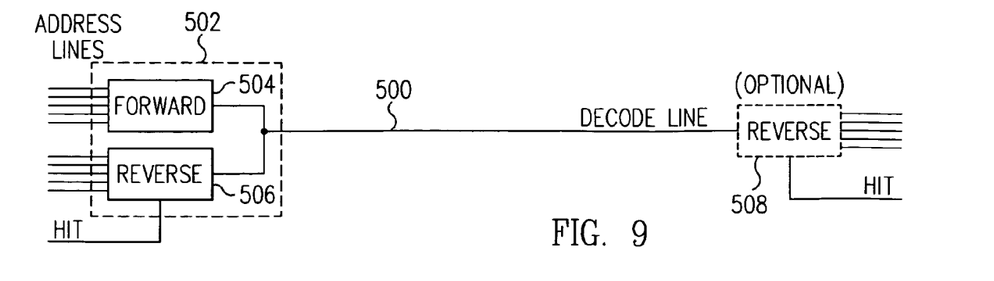
FIG. 9 depicts a single dual mode decoder coupled at one end of the decoded lines, which may be implemented as a forward decoder and a reverse decoder which can operate independently. Also shown is an optional second reverse decoder coupled at the other end of the decoded lines.

In FIG. 9 a single dual mode decoder 502 is coupled at some point along the decoded lines 500 (as shown here, at one end of the decode lines 500). If the dual-mode decoder 502 is implemented as a forward decoder 504 which can operate independently of a reverse decoder 506, then such a configuration may be thought of as two decoders respectively connected at respective locations along a group of decoded lines even though here such respective locations may both be at the same end of the decoded lines 500. Also shown is an optional second reverse decoder 508 coupled at the other end of the decoded lines.

Most memory arrays are designed having a relatively high degree of uniformity. For example, usually every bit line includes the same number of memory cells. As another example, the number of bit lines, word lines, array blocks, and even memory planes is frequently an integral power of two in number (i.e., $2^N$), for ease and efficiency of decode circuitry. But such regularity or consistency is certainly not required for any of the embodiments of the present invention. For example, word line segments on different layers may include different numbers of memory cells, the memory array may include three memory planes, word line segments within the first and last array block may be different in number of memory cells or bit line configuration, and any of many other irregular variations to the usual consistency of memory array design. Unless otherwise explicitly recited in the claims, such usual regularity, even as shown in the embodiments described herein, should not be imported into the meaning of any claim.

It should be appreciated that the designations top, left, bottom, and right are merely convenient descriptive terms for the four sides of a memory array. The word line segments for a block may be implemented as two inter-digitated groups of word line segments oriented horizontally, and the bit lines for a block may be implemented as two inter-digitated groups of bit lines oriented vertically. Each respective group of word lines or bit lines may be served by a respective decoder/driver circuit and a respective sense circuit on one of the four sides of the array. Suitable column circuits are set forth in "Tree Decoder Structure Particularly Well Suited to Interfacing Array Lines Having Extremely Small Layout Pitch," U.S. patent application Ser. No. 10/306,888, filed Nov. 27, 2002, which application is hereby incorporated by reference in its entirety.

Word lines may also be referred to as row lines or X-lines, and bit lines may also be referred to as column lines or Y-lines. The distinction between "word" lines and "bit" lines may carry at least two different connotations to those skilled in the art. When reading a memory array, it is assumed by some practitioners that word lines are "driven" and bit lines are "sensed." In this regard, X-lines (or word lines) are usually contemplated as being connected to the gate terminal of memory cell transistors, or the switch terminal of the memory cell switch device, if present. The Y-lines (or bit lines) are usually contemplated as being connected to a switched terminal of the memory cell (e.g., source/drain terminal). Secondly, the memory organization (e.g., data bus width, number of bits simultaneously read during an operation, etc.) may have some association with viewing one set of the two array lines more aligned with data "bits" rather than data "words." Consequently, the designations herein of X-lines, word lines, and row lines, and of Y-lines, bit lines, and column lines are illustrative of the various embodiments but should not be viewed in a restrictive sense, but rather a more general sense.

As used herein, word lines (e.g., including word line segments) and bit lines usually represent orthogonal array lines, and generally follow a common assumption in the art that word lines are driven and bit lines are sensed, at least during a read operation. Thus, the bit lines of an array may also be referred to as sense lines of the array. No particular implication should be drawn as to word organization by use of such terms. Moreover, as used herein, a "global array line" is an array line that connects to array line segments in more than one memory block, but no particular inference should be drawn suggesting such a global array line must traverse across an entire memory array or substantially across an entire integrated circuit.

As used herein, a passive element memory array includes a plurality of 2-terminal memory cells, each connected between an associated X-line and an associated Y-line. Such a memory array may be a two-dimensional (planar) array or may be a three-dimensional array having more than one plane of memory cells. Each such memory cell has a non-linear conductivity in which the current in a reverse direction (i.e., from cathode to anode) is lower than the current in a forward direction. Application of a voltage from anode to cathode greater than a programming level changes the conductivity of the memory cell. The conductivity may decrease when the memory cell incorporates a fuse technology, or may increase when the memory cell incorporates an anti-fuse technology. A passive element memory array is not necessarily a one-time programmable (i.e., write once) memory array.

Such passive element memory cells may generally be viewed as having a current steering element directing current in a direction and another component which is capable of changing its state (e.g., a fuse, an antifuse, a capacitor, a resistive element, etc.). The programming state of the memory element can be read by sensing current flow or voltage drop when the memory element is selected.

In various embodiments of the invention described herein, many different memory cell technologies are contemplated for use. Suitable three-dimensional anti-fuse memory cell structures, configurations, and processes include, without limitation, those described in: U.S. Pat. No. 6,034,882 to Johnson, et al, entitled "Vertically Stacked Field Programmable Nonvolatile Memory and Method of Fabrication"; U.S. Pat. No. 6,420,215 to Knall, et al, entitled "Three-Dimensional Memory Array and Method of Fabrication"; U.S. Pat. No. 6,525,953 to Johnson, entitled "Vertically-Stacked, Field Programmable Nonvolatile Memory and Method of Fabrication"; U.S. Patent Application Publication No. 2004-0002184 A1, by Cleeves, entitled "Three Dimensional Memory"; and U.S. patent application Ser. No. 10/326,470 by Herner, et al, filed Dec. 19, 2002, entitled "An Improved Method for Making a High Density Nonvolatile Memory". Each of these enumerated disclosures is incorporated herein by reference in its entirety.

The present invention is contemplated for advantageous use with any of a wide variety of memory cell technologies and memory array configurations, including both traditional single-level memory arrays and multi-level (i.e., three-dimensional) memory arrays, and particularly those having extremely dense X-line or Y-line pitch requirements. In certain embodiments, the memory cells may be comprised of semiconductor materials, as described in U.S. Pat.No. 6,034,882 to Johnson et al., and in U.S. Pat. No. 5,835,396 to Zhang. In certain embodiments, an antifuse memory cell is contemplated. Other types of memory arrays, such as MRAM and organic passive element arrays, can also be used. MRAM (magnetoresistive random access memory) is based on magnetic memory elements, such as a magnetic tunnel junction (MTJ). MRAM technology is described in "A 256 kb 3.0V 1T1MTJ Nonvolatile Magnetoresistive RAM" by Peter K. Naji et al., published in the Digest of Technical Papers of the 2001 IEEE International Solid-State Circuits Conference, ISSCC 2001/Session 7/Technology Directions: Advanced Technologies/7.6, Feb. 6, 2001 and pages 94-95, 404-405 of ISSCC 2001 Visual Supplement. Certain passive element memory cells may be used which incorporate layers of organic materials including at least one layer that has a diode-like characteristic conduction and at least one organic material that changes conductivity with the application of an electric field. U.S. Pat. No. 6,055,180 to Gudensen et al. describes such organic passive element arrays. Memory cells comprising materials such as phase-change materials and amorphous solids can also be used. See U.S. Pat. No. 5,751,012 to Wolstenholme et al., and U.S. Pat. No. 4,646,266 to Ovshinsky et al. In other embodiments, three-terminal memory cells may also be employed, rather than two-terminal passive element memory cells, and multiple X-lines (or row lines) selected to sum currents from more than one memory cell on a selected Y-line (or bit line). Such memory cells include flash EPROM and EEPROM cells, which are well known in the art. Moreover, other memory array configurations having extremely dense X-line and/or Y-line pitch requirements are also contemplated such as, for example, those incorporating tin-film transistor (TFT) EEPROM memory cells, as described in "Dense Arrays and Charge Storage Devices, and Methods for Making Same," by Thomas H. Lee, et al., U.S. Patent Application Publication No. US 2002-0028541 A1, and for those incorporating TFT NAND memory arrays, as described in "Programmable Memory Array Structure Incorporating Series-Connected Transistor Strings and Methods for Fabrication and Operation of Same" by Scheuerlein, et al., U.S. Patent Application Publication No. US 2004-0125629 A1, and in "Integrated Circuit Including Memory Array Incorporating Multiple Types of NAND String Structures" by Luca G. Fasoli and Roy E. Scheuerlein, U.S. application Ser. No. 11/026,492 filed on even date herewith, which applications are hereby incorporated by reference.

The directionality of various array lines in the various figures is merely convenient for ease of description of the two groups of crossing lines in the array. While word lines are usually orthogonal to bit lines, such is not necessarily required. As used herein, an integrated circuit memory array is a monolithic integrated circuit structure, rather than more than one integrated circuit device packaged together or in close proximity.

The block diagrams herein may be described using the terminology of a single node connecting the blocks. Nonetheless, it should be appreciated that, when required by the context, such a "node" may actually represent a pair of nodes for conveying a differential signal, or may represent multiple separate wires (e.g., a bus) for carrying several related signals or for carrying a plurality of signals forming a digital word or other multi-bit signal.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Nonetheless, in the interest of clarity, not all of the routine features of the implementations described herein are shown and described. It should, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

For example, decisions as to the number of memory cells within each array or sub-array, the particular configuration chosen for word line and bit line pre-decoder and decoder circuits and bit line sensing circuits, as well as the word organization, are all believed to be typical of the engineering decisions faced by one skilled in the art in practicing this invention in the context of developing a commercially-viable product. As is well known in the art, various row and column decoder circuits are implemented for selecting a memory block, and a word line and bit line within the selected block, based upon address signals and possibly other control signals. Nonetheless, even though a mere routine exercise of engineering effort is believed to be required to practice this invention, such engineering efforts may result in additional inventive efforts, as frequently occurs in the development of demanding, competitive products.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. The invention is contemplated to include circuits, related methods or operation, related methods for making such circuits, and computer-readable medium encodings of such circuits and methods, all as described herein, and as defined in the appended claims. As used herein, a computer-readable medium includes at least disk, tape, or other magnetic, optical, semiconductor (e.g., flash memory cards, ROM), or electronic medium and a network, wireline, wireless or other communications medium. An encoding of a circuit may include circuit schematic information, physical layout information, behavioral simulation information, and/or may include any other encoding from which the circuit may be represented or communicated.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention. Moreover, the embodiments described above are specifically contemplated to be used alone as well as in various combinations. Accordingly, other embodiments, variations, and improvements not described herein are not necessarily excluded from the scope of the invention.

What is claimed is:

1. An integrated circuit comprising:
   a memory array having a first plurality of decoded lines traversing across the memory array in a first direction;
   a pair of decoder circuits, one decoder circuit coupled to each of the plurality of decoded lines at one respective location along said decoded lines, and the other decoder circuit coupled to each of the plurality of decoded lines at another respective location along said decoded lines, both decoder circuits coupled to receive like address information.

2. The integrated circuit as recited in claim 1 wherein during a normal operating mode, both decoder circuits are enabled in a forward decode mode to decode the address information and drive a selected one of the decoded lines.

3. The integrated circuit as recited in claim 1 wherein the pair of decoder circuits are respectively coupled to each of the plurality of decoded lines generally at opposite ends of said decoded lines.

4. The integrated circuit as recited in claim 1 wherein the memory array comprises a three-dimensional memory array having more than one plane of memory cells formed above a substrate.

5. The integrated circuit as recited in claim 1 wherein the plurality of decoded lines comprise global word lines.

6. The integrated circuit as recited in claim 5 wherein the global word lines are coupled to multi-headed local word line drivers associated with memory blocks traversed by the global word lines.

7. The integrated circuit as recited in claim 6 wherein the memory array comprises a three-dimensional memory array having more than one plane of memory cells formed above a substrate.

8. The integrated circuit as recited in claim 7 wherein the multi-headed local word line drivers are configured to simultaneously select local word lines on more than one word line layer of the memory array.

9. The integrated circuit as recited in claim 5 wherein one decoder has at least a forward decode mode of operation and the other has at least a reverse decode mode of operation, arranged so that one decoder may be enabled in the reverse decode mode when the other decoder is enabled in the forward decode mode.

10. The integrated circuit as recited in claim 1 wherein the plurality of decoded lines comprise local array lines coupled directly to memory cells.

11. The integrated circuit as recited in claim 1 wherein one decoder has at least a forward decode mode of operation and the other has at least a reverse decode mode of operation, arranged so that one decoder may be enabled in the reverse decode mode when the other decoder is enabled in the forward decode mode.

12. The integrated circuit as recited in claim 11 wherein at least one of the decoders has both a forward decode mode of operation and a reverse decode mode of operation.

13. The integrated circuit as recited in claim 12 wherein:
both decoders include at least a forward decode mode of operation; and
during a normal operating mode, both decoders are enabled in the forward decode mode.

14. The integrated circuit as recited in claim 12 wherein both decoders have a forward decode mode of operation and a reverse decode mode of operation.

15. The integrated circuit as recited in claim 14 wherein during a normal operating mode, both decoders are enabled in the forward decode mode.

16. The integrated circuit as recited in claim 14 wherein during a normal operating mode, one decoder is enabled in the forward decode mode and the other decoder is disabled.

17. The integrated circuit as recited in claim 14 wherein:
during a first test mode, one decoder may be enabled in the reverse decode mode and the other decoder may be enabled in the forward decode mode; and
during a second test mode, the other decoder may be enabled in the reverse decode mode and the one decoder may be enabled in the forward decode mode.

18. The integrated circuit as recited in claim 17 wherein the plurality of decoded lines comprise global word lines.

19. The integrated circuit as recited in claim 18 wherein the global word lines are coupled to multi-headed local word line drivers associated with memory blocks traversed by the global word lines.

20. The integrated circuit as recited in claim 17 wherein the memory array comprises a three-dimensional memory array having more than one plane of memory cells formed above a substrate.

21. The integrated circuit as recited in claim 17 wherein the multi-headed local word line drivers are configured to simultaneously select local word lines on more than one word line layer of the memory array.

22. The integrated circuit of claim 1 embodied in computer readable descriptive form suitable for use in design, test or fabrication of the integrated circuit.

23. An integrated circuit comprising:
a memory array having a plurality of decoded lines traversing the memory array;
first and second dual-mode decoder circuits respectively coupled to each end of the decoded lines;
wherein, in a normal operating mode, both first and second decoders are configured to operate in a forward decode mode; and
wherein, in a first test mode, the first decoder is configured to operate in the forward decode mode, and the second decoder is configured to operate in a reverse decode mode.

24. The integrated circuit as recited in claim 23 wherein, in a second test mode, the first decoder is configured to operate in the reverse decode mode, and the second decoder is configured to operate in the forward decode mode.

25. The integrated circuit as recited in claim 23 wherein the memory array comprises a three-dimensional memory array having more than one plane of memory cells formed above a substrate.

26. The integrated circuit as recited in claim 23 wherein the plurality of decoded lines comprise global word lines.

27. The integrated circuit as recited in claim 26 wherein the global word lines are coupled to multi-headed local word line drivers associated with memory blocks traversed by the global word lines.

28. A method for operating an integrated circuit including a memory array, said memory array including a plurality of decoded lines traversing across the memory array and further including a first and second decoder circuit respectively coupled to the plurality of decoded lines at respective different locations along said decoded lines, said method comprising the steps of:
presenting address information to both the first and second decoder circuits; and
in a normal operating mode, enabling both the first and second decoder circuits in a forward decode mode, thereby decoding the address information and driving a selected one of the plurality of decoded lines from said two different locations along said line.

29. The method as recited in claim 28 wherein the first and second decoder circuits are respectively coupled to opposite ends of the plurality of decoded lines.

30. The method as recited in claim 28 further comprising:
a first test mode comprising the steps of:
enabling the first decoder circuit in the forward decode mode, thereby decoding the address information and driving a selected one of the plurality of decoded lines; and
enabling the second decoder circuit in a reverse decode mode, thereby comparing the address information and the selected one of the plurality of decoded lines, and driving an output match signal if the address information corresponds to the selected one of the plurality of decoded lines.

31. The method as recited in claim 30 further comprising the step of sequencing through the address information.

32. The method as recited in claim 30 further comprising:
a second test mode comprising the steps of:
enabling the second decoder circuit in the forward decode mode, thereby decoding the address information and driving a selected one of the plurality of decoded lines; and enabling the first decoder circuit in the reverse decode mode, thereby comparing the address information and the selected one of the plurality of decoded lines, and driving the output match signal if the address information corresponds to the selected one of the plurality of decoded lines.

33. A method for operating a memory array, said memory array including a plurality of decoded lines traversing across the memory array, said method comprising:
providing a first decoder circuit coupled to each of the plurality of decoded lines at one respective location along said decoded lines, and a second decoder circuit coupled to each of the plurality of decoded lines at another respective location along said decoded lines, both first and second decoder circuits coupled to receive like address information; and
configuring the first decoder circuit in a forward decode mode to decode the address information presented thereto and drive a selected one of the plurality of decoded lines, and configuring the second decoder in a reverse decode mode to assert an output match signal if the selected one of decoded lines corresponds to the same address information.

34. The method as recited in claim 33 wherein the first and second decoder circuits are respectively coupled generally to respective ends of the plurality of decoded lines.

35. The method as recited in claim 33 further comprising the step of sequencing through all combinations of the address information.

36. The method as recited in claim 33 further comprising the steps of configuring the second decoder circuit in a forward decode mode to thereby decode the address information presented thereto and drive a selected one of the decoded lines, and configuring the first decoder in a reverse decode mode to assert an output match signal if the selected one of decoded lines corresponds to the same address information.

37. An integrated circuit comprising:
a memory array including a plurality of decoded lines traversing across the memory array;
first means for decoding address information and driving a selected one of the plurality of decoded lines; and
second means distinct from said first means for comparing the address information and the selected one of the plurality of decoded lines, and driving an output match signal if the address information corresponds to the selected one of the plurality of decoded lines.

38. The integrated circuit as recited in claim 37 wherein the first and second means are respectively coupled generally to opposite ends of the plurality of decoded lines.

39. The integrated circuit as recited in claim 37 wherein the first means further includes a capability for comparing the address information and a selected one of the plurality of decoded lines, and driving an output match signal if the address information corresponds to the selected one of the plurality of decoded lines.

40. The integrated circuit as recited in claim 37 wherein the memory array comprises a three-dimensional memory array having more than one plane of memory cells formed above a substrate.

41. A decoder circuit configured, in a first mode of operation, for decoding address information conveyed thereto and asserting a corresponding one of a plurality of decoded outputs, and further configured, in a second mode of operation, for asserting a match signal if the address information corresponds to an asserted one of the plurality of decoded outputs which is asserted external to the decoder circuit.

42. The decoder circuit as recited in claim 41 further comprising:
a plurality of multi-headed decoder circuits; and
a plurality of bus lines which are used in the first mode of operation as bias lines for the plurality of multi-headed decoder circuits, and which bus lines, in the second mode of operation, are coupled to and driven by a group of decoded outputs which are driven external to the decoder.

43. The decoder circuit as recited in claim 42 wherein the multi-headed decoder circuits comprise individual decoder heads, each of which includes at most three transistor devices.

* * * * *